US011979142B2

(12) United States Patent
Imada

(10) Patent No.: US 11,979,142 B2
(45) Date of Patent: May 7, 2024

(54) GATE DRIVER

(71) Applicant: Rohm Co., Ltd., Kyoto (JP)

(72) Inventor: Takehiko Imada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 78 days.

(21) Appl. No.: 17/794,701

(22) PCT Filed: Sep. 15, 2020

(86) PCT No.: PCT/JP2020/034942
§ 371 (c)(1),
(2) Date: Jul. 22, 2022

(87) PCT Pub. No.: WO2021/166303
PCT Pub. Date: Aug. 26, 2021

(65) Prior Publication Data
US 2023/0098267 A1      Mar. 30, 2023

(30) Foreign Application Priority Data

Feb. 19, 2020   (JP) ................................. 2020-025856

(51) Int. Cl.
| | | |
|---|---|---|
| *H03K 17/06* | (2006.01) | |
| *H02M 1/088* | (2006.01) | |
| *H02M 3/158* | (2006.01) | |

(52) U.S. Cl.
CPC .......... *H03K 17/063* (2013.01); *H02M 1/088* (2013.01); *H02M 3/158* (2013.01)

(58) Field of Classification Search
None
See application file for complete search history.

(56) References Cited

U.S. PATENT DOCUMENTS

| | | | | |
|---|---|---|---|---|
| 9,369,038 | B2 * | 6/2016 | Sakai | H01L 27/0727 |
| 9,673,706 | B2 * | 6/2017 | Matsuki | H01L 27/092 |
| 10,090,763 | B1 * | 10/2018 | Mercer | H02M 3/1582 |
| 10,396,776 | B2 * | 8/2019 | Davila | H03K 17/161 |
| 2008/0084243 | A1 * | 4/2008 | Kanamori | H02M 3/156 |
| | | | | 327/589 |

(Continued)

FOREIGN PATENT DOCUMENTS

JP    2004304527    10/2004

OTHER PUBLICATIONS

International Search Report in International Appln. No. PCT/JP2020/034942, dated Dec. 22, 2020, 5 pages (with English Translation).

*Primary Examiner* — Thomas J. Hiltunen
*Assistant Examiner* — Khareem E Almo
(74) *Attorney, Agent, or Firm* — Fish & Richardson P.C.

(57) ABSTRACT

A gate driver, which drives an N-channel type transistor connected between an application terminal of an input voltage and an application terminal of a switch voltage, includes a capacitor circuit connected between an application terminal of a boot voltage higher than the switch voltage by a voltage between both ends of the boot capacitor and the application terminal of the switch voltage, and a timing control circuit that charges an input gate capacitance of the transistor with the boot voltage after precharging the same with the input voltage during turn-on transition of the transistor, and decreases capacitance value of the capacitor circuit after the turn-on transition of the transistor.

10 Claims, 9 Drawing Sheets

(56) References Cited

U.S. PATENT DOCUMENTS

| | | | | |
|---|---|---|---|---|
| 2014/0062431 A1* | 3/2014 | Yanase | .................... | G05F 1/46 |
| | | | | 323/271 |
| 2021/0286400 A1* | 9/2021 | Saeki | ................. | H02M 7/5387 |
| 2022/0416663 A1* | 12/2022 | Giuliano | ........... | H01L 23/49575 |
| 2023/0361672 A1* | 11/2023 | Takobe | ................ | H02M 3/158 |

* cited by examiner

FIG. 5

|  | SW0 | SW1 | SW2 | SW3 | SW4 | SW5 | SW6 |
|---|---|---|---|---|---|---|---|
| (1) t1-t2 | ON | OFF | ON | OFF | ON | OFF | ON |
| (2) t3-t4 | OFF | ON | OFF | OFF | ON | OFF | ON |
| (3) t4-t5 | OFF | OFF | OFF | ON | ON | OFF | ON |
| (4) t5-t6 | OFF | OFF | OFF | ON | OFF | ON | OFF |

GATE DRIVER

TECHNICAL FIELD

The invention disclosed in this specification relates to a gate driver.

BACKGROUND ART

Conventionally, a gate driver is widely and generally known, which is supplied with a boot voltage from a bootstrap circuit and drives an N-channel type transistor (such as a metal oxide semiconductor field effect transistor (MOSFET) or an insulated gate bipolar transistor (IGBT)) (see, for example, Patent Document 1).

LIST OF CITATIONS

Patent Literature

Patent Document 1: JP-A-2004-304527

SUMMARY OF THE INVENTION

Technical Problem

However, if a boot capacitor has a small capacitance, it is difficult to maintain the boot voltage at a desired value, and transistor gate drive may be hindered.

In view of the above-mentioned problem found by the inventor of this application, it is an object of the invention disclosed in this specification to provide a gate driver that hardly cause a hindrance in transistor gate drive even if the boot capacitor has a small capacitance.

Means for Solving the Problem

For instance, a gate driver disclosed in this specification, which drives an N-channel type transistor connected between an application terminal of an input voltage and an application terminal of a switch voltage, includes a capacitor circuit connected between an application terminal of a boot voltage and the application terminal of the switch voltage, the boot voltage being higher than the switch voltage by a voltage between both ends of a boot capacitor, and a timing control circuit that charges an input gate capacitance of the transistor with the boot voltage after precharging the same with the input voltage during turn-on transition of the transistor, and decreases capacitance value of the capacitor circuit after the turn-on transition of the transistor (first structure).

Note that the gate driver having the first structure described above may have a structure further including a first internal switch connected between the application terminal of the input voltage and a gate of the transistor, a second internal switch connected between the gate of the transistor and the application terminal of the switch voltage, and a third internal switch connected between the application terminal of the boot voltage and the gate of the transistor, in which the timing control circuit controls switching timings of the first internal switch, the second internal switch, and the third internal switch (second structure).

In addition, the gate driver having the second structure described above may have a structure in which the capacitor circuit includes a first capacitor having a first end connected to the application terminal of the boot voltage, a second capacitor having a first end connected to the application terminal of the switch voltage, a fourth internal switch connected between a second end of the first capacitor and the application terminal of the switch voltage, a fifth internal switch connected between the second end of the first capacitor and a second end of the second capacitor, and a sixth internal switch connected between the application terminal of the boot voltage and the second end of the second capacitor, in which the timing control circuit controls switching timings of the fourth internal switch, the fifth internal switch, and the sixth internal switch (third structure).

In addition, the gate driver having the third structure described above may have a structure in which the timing control circuit sequentially switches among a first drive phase, in which the first internal switch, the third internal switch, and the fifth internal switch are turned off, while the second internal switch, the fourth internal switch, and the sixth internal switch are turned on; a second drive phase, in which the second internal switch, the third internal switch, and the fifth internal switch are turned off, while the first internal switch, the fourth internal switch, and the sixth internal switch are turned on; a third drive phase, in which the first internal switch, the second internal switch, and the fifth internal switch are turned off, while the third internal switch, the fourth internal switch, and the sixth internal switch are turned on; and a fourth drive phase, in which the first internal switch, the second internal switch, the fourth internal switch, and the sixth internal switch are turned off, while the third internal switch and the fifth internal switch are turned on (fourth structure).

In addition, the gate driver having any one of the second to fourth structures described above may have a structure in which the first internal switch includes an NDMOSFET having a drain connected to the application terminal of the input voltage, and an NMOSFET having a source connected to a source of the NDMOSFET and a drain connected to the gate of the transistor (fifth structure).

In addition, the gate driver having the fifth structure described above may have a structure in which the timing control circuit turns on the NMOSFET before turning on the NDMOSFET, and turns off the NMOSFET before turning on the third internal switch (sixth structure).

In addition, the gate driver having any one of the second to sixth structures described above may have a structure in which the third internal switch is a PDMOSFET (seventh structure).

In addition, for example, a semiconductor device disclosed in this specification may have a structure including an integration of the gate driver having any one of the first to seventh structures described above (eighth structure).

In addition, the semiconductor device having the eighth structure described above may have a structure further including an integration of a boat capacitor connected between the application terminal of the boot voltage and the application terminal of the switch voltage (ninth structure).

In addition, the semiconductor device having the eighth or ninth structure described above may have a structure further including an integration of an N-channel type transistor connected between the application terminal of the input voltage and the application terminal of the switch voltage (tenth structure).

Advantageous Effects of the Invention

According to the invention disclosed in this specification, it is possible to provide a gate driver that hardly cause a hindrance in transistor gate drive even if the boot capacitor has a small capacitance.

BRIEF DESCRIPTION OF DRAWINGS

FIG. 5 is a diagram illustrating switch switching states of the individual drive phases.

DESCRIPTION OF EMBODIMENTS

Switching Power Supply

Figure 1:
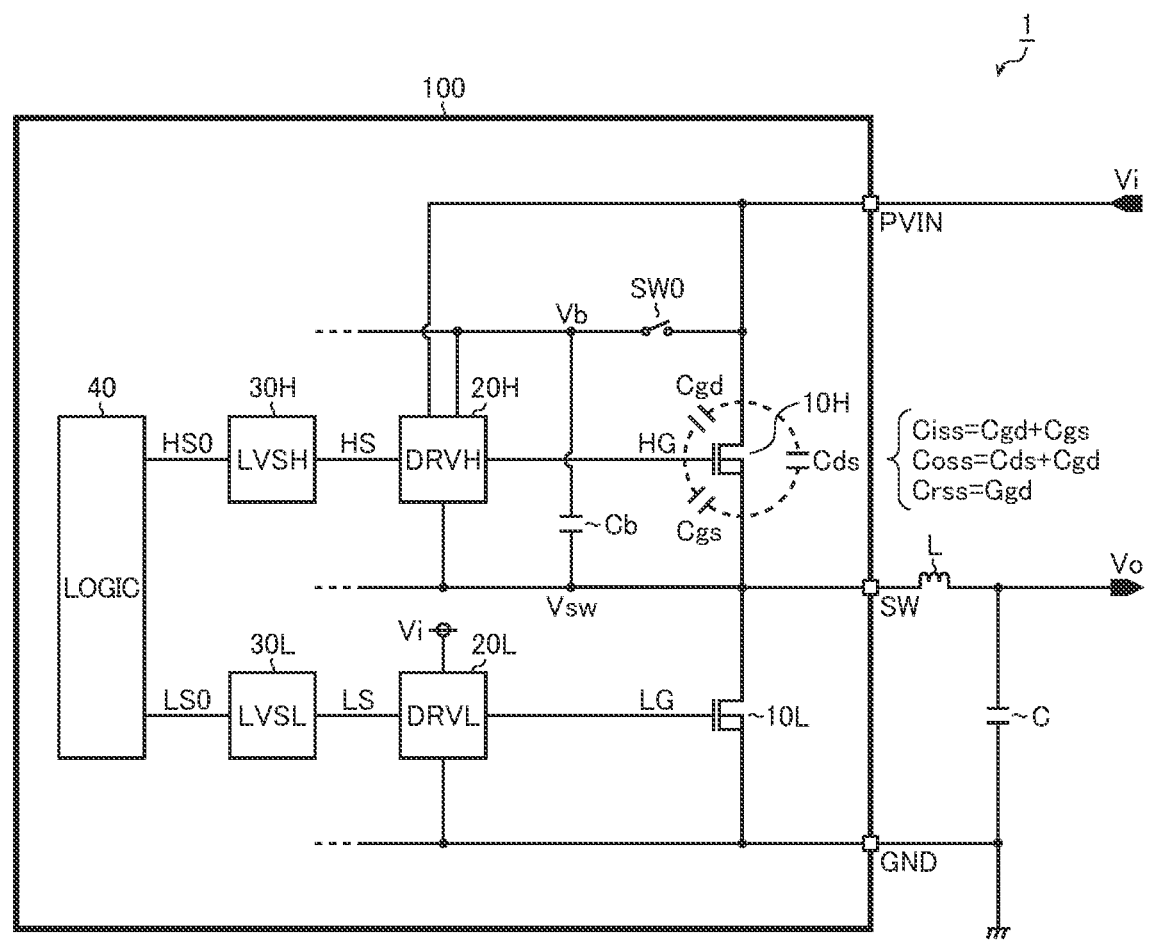
FIG. 1 is a diagram illustrating an overall structure of a switching power supply.

FIG. 1 is a diagram illustrating an overall structure of a switching power supply. A switching power supply 1 of this structural example is a step-down type DC/DC converter that steps down an input voltage Vi to generate a desired output voltage Vo, and it includes a semiconductor device 100 and discrete components attached thereto (an inductor L and a capacitor C are exemplified in this diagram).

The semiconductor device 100 is a main body that integrally controls operation of the switching power supply 1 (a so-called power supply control IC), and has a plurality of external terminals arranged to establish electric connection with outside of the device (a PVIN pin, a SW pin, and a GND pin are exemplified in this diagram).

The PVIN pin (a power supply terminal) is connected to an application terminal of the input voltage Vi. The SW pin (a switch terminal) is connected to a first end of the inductor L. A second end of the inductor L and a first end of the capacitor C are connected to an application terminal of the output voltage Vo. The GND pin (a ground terminal) and a second end of the capacitor C are connected to the ground terminal. The inductor L and the capacitor C connected in this manner function as a rectifying and smoothing circuit, which rectifies and smooths a switch voltage Vsw having a rectangular waveform at the SW pin so as to generate the output voltage Vo.

Semiconductor Device

Next, with reference to FIG. 1, an internal structure of the semiconductor device 100 is described. The semiconductor device 100 of this structural example includes an upper side transistor 10H, a lower side transistor 10L, an upper side driver 20H, a lower side driver 20L, an upper side level shifter 30H, a lower side level shifter 30L, a logic circuit 40, a hoot capacitor Cb, and an internal switch SW0, which are integrated.

The upper side transistor 10H is a semiconductor element that functions as an upper side switch (output transistor) of a half bridge output stage connected between the PVIN pin and the GND pin, and is constituted of an NMOSFET in this diagram. Specific connection relationship is described below. The upper side transistor 10H has a drain connected to the PVIN pin. A source of the upper side transistor 10H is connected to the SW pin. A gate of the upper side transistor 10H is connected to an output terminal of the upper side driver 20H (i.e. an application terminal of an upper side gate drive signal HG).

The upper side transistor 10H turns on when the upper side gate drive signal HG is at high level (i.e. Vb), and it turns off when the upper side gate drive signal HG is at low level (i.e. Vsw)

Note that the upper side transistor 10H is accompanied with a gate-drain parasitic capacitance Cgd, a gate-source parasitic capacitance Cgs, and a drain-source parasitic capacitance Cds. Here, the sum of the gate-drain parasitic capacitance Cgd and the gate-source parasitic capacitance Cgs corresponds to an input gate capacitance Ciss of the upper side transistor 10H (Ciss=Cgd+Cgs). In contrast, the sum of the drain-source parasitic capacitance Cds and the gate-drain parasitic capacitance Cgd corresponds to an output gate capacitance Coss of the upper side transistor 10H (Coss=Cds+Cgd). In addition, the gate-drain parasitic capacitance Cgd corresponds to a feedback gate capacitance Crss of the upper side transistor 10H (Crss=Cgd).

The lower side transistor 10L is a semiconductor element that functions as a lower side switch (synchronous rectification transistor) of the half bridge output stage described above, and is constituted of an NMOSFET in this diagram. Specific connection relationship is described below. A drain of the lower side transistor 10L is connected to the SW pin. A source of the lower side transistor 10L is connected to the GND pin. A gate of the lower side transistor 10L is connected to an output terminal of the lower side gate driver 20L (i.e. an application terminal of the lower side gate drive signal LG).

The lower side transistor 10L, turns on when the lower side gate drive signal LG is at high level (i.e. Vi), and it turns off when the lower side gate drive signal LG is at low level (i.e. GND).

However, the rectification method of the switching power supply 1 is not necessarily limited to the synchronous rectification but may be a diode rectification method. In that case, instead of the lower side transistor 10L, a diode should be incorporated or externally attached so that the cathode is connected to the SW pin and the anode is connected to the GND pin.

The upper side driver 20H receives an input of an upper side gate control signal HS and outputs the upper side gate drive signal HG. Note that the upper side driver 20H basically sets the upper side gate drive signal HG at high level (i.e. Vb) when the upper side gate control signal HS is at high level (i.e. Vb), and sets the same at low level (i.e. Vsw) when the upper side gate control signal HS is at low level (i.e. Vsw).

In addition, the upper side driver 20H is provided with various functions so that gate drive of the upper side transistor 10H is hardly hindered even if the boot capacitor Cb has a small capacitance (e.g. a precharging function using the input voltage Vi, a boot voltage maintaining function using a capacitor circuit, and the like, details of which will be described later).

The lower side driver 20L receives an input of a lower side gate control signal LS and outputs the lower side gate drive signal LG. The lower side driver 20L basically sets the lower side gate drive signal LG at high level (i.e. Vi) when the lower side gate control signal LS is at high level (i.e. Vi), and sets the same at low level (i.e. GND) when the lower side gate control signal LS is at low level (i.e. GND).

The upper side level shifter 30H shifts a level of an upper side logic signal HS0 (e.g. LV-GND) so as to generate the upper side gate control signal HS (e.g. Vb-Vsw).

The lower side level shifter 30L shifts a level of a lower side logic signal LS0 (e.g. LV-GND) so as to generate the lower side gate control signal LS (e.g. Vi-GND), The logic circuit 40 generates the upper side logic signal HS0 and the lower side logic signal LS0, so that the desired output voltage Vo is generated from the input voltage Vi. Note that the feedback control method of the output voltage Vo can be any known method (such as voltage mode control, current mode control, or hysteresis control (ripple control)), and detailed description thereof is omitted.

The boot capacitor Cb is connected between an application terminal of the boot voltage Vb and the SW pin (i.e. an application terminal of the switch voltage Vsw).

The internal switch SW0 is connected between the application terminal of the boot voltage Vb and the PVIN pin (i.e. the application terminal of the input voltage Vi). For instance, the internal switch SW0 turns on during ON period of the lower side transistor 10L (i.e. a low level period of the switch voltage Vsw), and turns off during ON period of the upper side transistor 10H (i.e. a high level period of the switch voltage Vsw). Note that the internal switch SW0 may be connected between the application terminal of the boot voltage Vb and an application terminal of an internal power supply voltage VREF (e.g. 5V).

The boot capacitor Cb and the internal switch SW0 connected in this manner constitute a bootstrap circuit that generates the boot voltage Vb higher than the switch voltage Vsw by a voltage between both ends of the boot capacitor Cb.

As illustrated in this diagram, the boot capacitor Cb is incorporated in the semiconductor device 100, and the number of externally attached discrete components can be reduced. However, an IC incorporated type boot capacitor Cb cannot have sufficient capacitance value (e.g. approximately five times the input gate capacitance Ciss accompanying the upper side transistor 10H is assumed).

Therefore, if the upper side driver 10H is not specially devised, due to the turn-on transition of the upper side transistor 10H, the charge stored in the boot capacitor Cb is absorbed by the charge of the input gate capacitance Ciss, and hence the boot voltage Vb decreases so that the gate drive of the upper side transistor 10H may be hindered.

In view of this consideration, the upper side driver 10H are variously devised so that the gate drive of the upper side transistor 10H is hardly hindered, even if the boot capacitor Cb has a small capacitance. In the following description, the upper side driver 20H is described in detail.

Upper Side Driver

Figure 2:
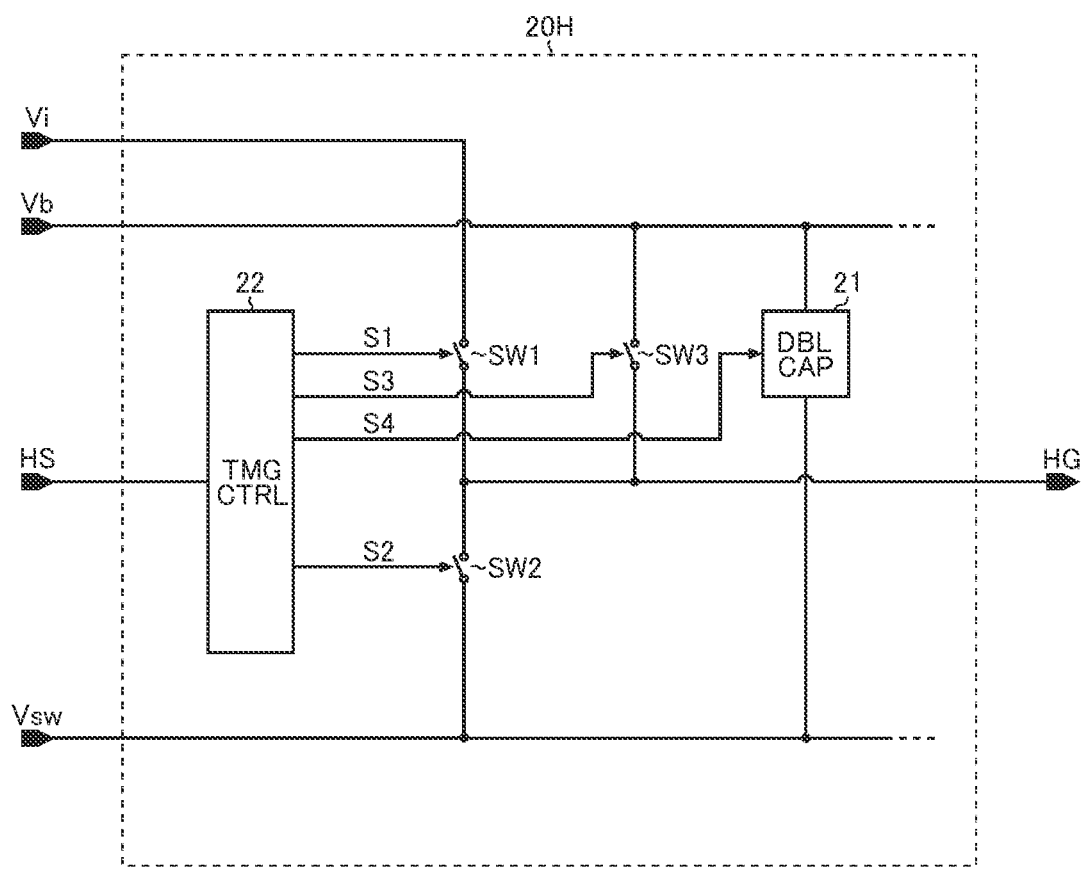
FIG. 2 is a diagram illustrating one structural example of an upper side driver.

FIG. 2 is a diagram illustrating one structural example of the upper side driver 20H. The upper side driver 20H of this structural example includes internal switches SW1 to SW3, a capacitor circuit 21, and a timing control circuit 22.

The internal switch SW1 is connected between the application terminal of the input voltage Vi and an application terminal of the upper side gate drive signal HG (i.e. the gate of the upper side transistor 10H), and is turned on and off in accordance with a switch control signal S1.

The internal switch SW2 is connected between the application terminal of the upper side gate drive signal HG and the application terminal of the switch voltage Vsw, and is turned on and off in accordance with a switch control signal S2.

The internal switch SW3 is connected between the application terminal of the boot voltage Vb and the application terminal of the upper side gate drive signal HG, and is turned on and off in accordance with a switch control signal S3.

The capacitor circuit 21 is connected between the application terminal of the boot voltage Vb and the application terminal of the switch voltage Vsw, and its capacitance value C21 is switched in accordance with a switch control signal S4. Note that the capacitor circuit 21 includes a plurality of capacitors and an internal switch (that are not shown), and an internal structure thereof will be described later.

The timing control circuit 22 receives an input of the upper side gate control signal HS and generates the switch control signals S1 to S4, so as to control ON/OFF switching timings of the internal switches SW1 to SW3 and capacitance value switching timing of the capacitor circuit 22.

For instance, the timing control circuit 22 should generate the switch control signals S1 to S4, so as to charge the input gate capacitance Ciss of the upper side transistor 10H with the boot voltage Vb (turn off SW1, turn off SW2, and turn on SW3) after precharging the same with the input voltage Vi (turn on SW1, turn off SW2, and turn off SW3) during the turn-on transition of the upper side transistor 10H, and to decrease the capacitance value C21 of the capacitor circuit 21 after the turn-on transition of the upper side transistor 10H.

With this internal switch control, even if the boot capacitor Cb has a small capacitance. the decrease of the boot voltage Vb due to the turn-on transition of the upper side transistor 10H can be suppressed, and hence the gate drive of the upper side transistor 10H is hardly hindered (details will be described later).

Capacitor Circuit

Figure 3:
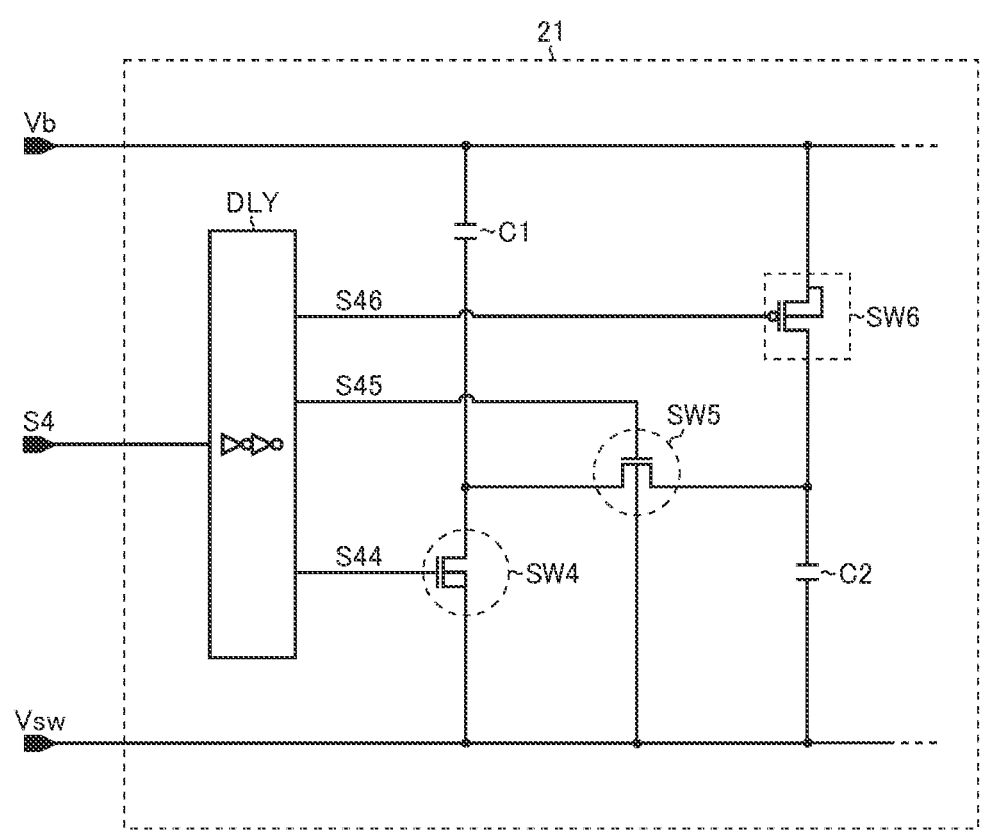
FIG. 3 is a diagram illustrating one structural example of a capacitor circuit.

FIG. 3 is a diagram illustrating one structural example of the capacitor circuit 21. The capacitor circuit 21 of this structural example is a so-called doubler capacitor (voltage doubler), and includes capacitors C1 and C2, a delay stage DLY, and internal switches SW4 to SW6.

The capacitor C1 has a first end connected to the application terminal of the boot voltage Vb.

The capacitor C2 has a first end connected to the application terminal of the switch voltage Vsw.

The delay stage DLY gives an appropriate delay to the switch control signal S4 so as to generate switch control signals S44, S45, and S46. In addition, in the delay stage DLY, logical levels of the switch control signal S4 may be inverted if necessary. For instance, an inverter stage including a plurality of inverters connected in series is used as the delay stage DLY, and among the plurality of inverters described above, output terminals of the inverters that output the switch control signals S44, S45, and S46, respectively, are connected to control terminals (gates) of the internal switches SW4, SW5, and SW6, respectively.

The internal switch SW4 (e.g. an NMOSFET) is connected between the second end of the capacitor C1 and the application terminal of the switch voltage Vsw, and is turned on and off in accordance with the switch control signal S44 (e.g. a delayed signal of the switch control signal S4). For instance, the internal switch SW4 turns on when the switch control signal S44 is at high level, and turns off when the switch control signal S44 is at low level.

The internal switch SW5 (e.g. an NMOSFET) is connected between the second end of the capacitor C1 and a second end of the capacitor C2, and is turned on and off in accordance with the switch control signal S45 (e.g. a delayed signal of the switch control signal S44). For instance, the internal switch SW5 turns on when the switch control signal S45 is at high level, and turns off when the switch control signal S45 is at low level.

The internal switch SW6 (e.g. a PDMOSFET) is connected between the application terminal of the boot voltage Vb and the second end of the capacitor C2, and is turned on and off in accordance with the switch control signal S46 (e.g. a delayed and logically inverted signal of the switch control signal S4). For instance, the internal switch SW6 turns off when the switch control signal S46 is at high level, and turns on when the switch control signal S46 is at low level.

In this way, ON/OFF switching timings of the internal switches SW4 to SW6 are controlled in accordance with the switch control signal S4 input from the timing control circuit 22.

In particular, the capacitor circuit 21 of this structural example has two operating states, including a first operating state in which the internal switches SW4 and SW6 are turned on while the internal switch SW5 is turned off, and a second operating state in which the internal switches SW4 and SW6 are turned off while the internal switch SW5 is turned on, oppositely to the first operating state. The operating states are described in detail below.

First, consider the first operating state in which the internal switches SW4 and SW6 are turned on while the internal switch SW5 is turned off. In this case, the capacitors C1 and C2 are connected in parallel between the application terminal of the boot voltage Vb and the application terminal of the switch voltage Vsw. Therefore, the capacitance value C21 of the capacitor circuit 21 satisfies C21=C1+C2. Note that in the first operating state described above, the capacitors C1 and C2 are charged in parallel.

Next, consider the case where the first operating state described above is transferred to the second operating state in which the internal switches SW4 and SW6 are turned off while the internal switch SW5 is turned on. In this case, the capacitors C1 and C2 are connected in series between the application terminal of the boot voltage Vb and the application terminal of the switch voltage Vsw. Therefore, the capacitance value C21 of the capacitor circuit 21 is decreased to satisfy C21=C1×C2/(C1+C2).

In this case, each of the capacitors C1 and C2 has charge stored in the first operating state described above. Therefore, supposing that the voltage between both ends of each of the capacitors C1 and C2 is VC just before the transition to the second operating state, the boot voltage Vb is increased from VC+Vsw to 2VC+Vsw just after the transition from the first operating state to the second operating state. In other words, the voltage VC between both ends is doubled.

Note that if the capacitance value of each of the capacitors C1 and C2 is increased more, the boot voltage Vb can be increased more, but occupying area thereof in the chip of the semiconductor device 100 is increased more. Therefore, considering the trade-off between them, it is preferred, for example, to set the capacitance value of each of the capacitors C1 and C2. so that the capacitance value C21 of the capacitor circuit 21 (C21=C1×C2/(C1+C2)) in the second operating state (i.e. the state where the capacitors C1 and C2 are connected in series) is approximately ½ of the input gate capacitance Ciss.

As a matter of course, the structure of the capacitor circuit 21 is not necessarily limited to that described above, but can be a structure that enables to realize m times boost of the voltage VC between both ends (m>1).

Internal Switch Control

Next, the ON/OFF switching control of the internal switches S1 to S6 performed by the timing control circuit 22 is described in detail with reference to the drawings.

Figure 4:
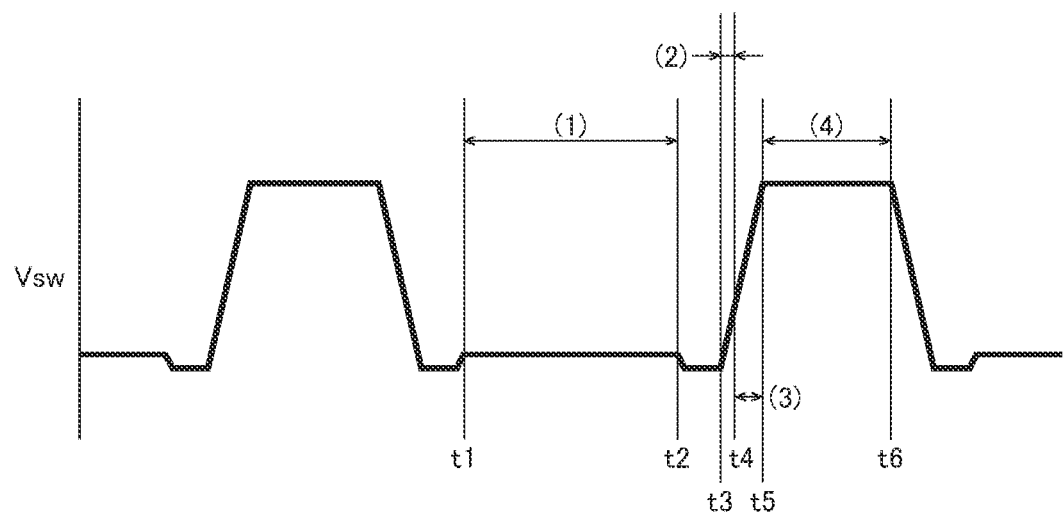
FIG. 4 is a diagram illustrating one example of drive phases.

FIG. 4 is a diagram illustrating one example of drive phases in the internal switch control, and shows a relationship among the switch voltage Vsw and drive phases (1) to (4). In this diagram, the drive phase (1) from time t1 to time t2 corresponds to the low level period of the switch voltage Vsw. The drive phase (2) from time t3 to time t4 corresponds to a rising period (first half) of the switch voltage Vsw. The drive phase (3) from time t4 to time t5 corresponds to the rising period (second half) of the switch voltage Vsw. The drive phase (4) from time t5 to time t6 corresponds to the high level period of the switch voltage Vsw.

FIG. 5 is a diagram illustrating ON/OFF switching states of the internal switches SW0 to SW6 in the drive phases (1) to (4) described above. Note that the internal switch SW0 is not necessarily controlled ON and OFF by the timing control circuit 22. but it is handled in the same manner as the internal switches SW1 to SW6 in this diagram, for convenience of description.

First, in the drive phase (1) (i.e. time t1 to time t2) corresponding to the low level period of the switch voltage Vsw, the internal switch SW0 is turned on so that the application terminal of the boot voltage Vb and the PVIN pin (i.e. the application terminal of the input voltage Vi) are electrically connected to each other. As a result, the boot capacitor Cb is charged until the voltage between both ends becomes nearly equal to the input voltage Vi.

In addition, in the drive phase (1), the timing control circuit 22 turns off the internal switches SW1 and SW3, and turns on the internal switch SW2. Therefore, the upper side gate drive signal HG becomes low level (i.e. Vsw), and the upper side transistor 10H is fully turned off.

In addition, in the drive phase (1), the timing control circuit 22 turns off the internal switch SW5, and turns on the internal switches SW4 and SW6. Therefore, the capacitors C1 and C2 are connected in parallel, and the capacitance value C21 of the capacitor circuit 21 satisfies C21=C1+C2.

Next, in the drive phase (2) (i.e. time t3 to time t4) corresponding to the rising period (first half) of the switch voltage Vsw, the internal switch SW0 is turned off, so that the application terminal of the boot voltage Vb and the PVIN pin are disconnected. In this case, the boot capacitor Cb has charge stored in the drive phase (1) described above. As a result, along with the rising switch voltage Vsw, the boot voltage Vb increases with a voltage value higher than the switch voltage Vsw by the voltage (~Vi) between both ends of the boot capacitor Cb (Vb≈Vsw+Vi).

In addition, in the drive phase (2), the timing control circuit 22 turns off the internal switches SW2 and SW3, and turns on the internal switch SW1. Therefore, the application terminal of the input voltage Vi and the application terminal of the upper side gate drive signal HG are electrically connected to each other, and the input gate capacitance Ciss of the upper side transistor 10H is precharged using the input voltage Vi.

In addition, in the drive phase (2), after the drive phase (1) described above, the timing control circuit 22 maintains the OFF state of the internal switch SW5 and the ON state of the internal switches SW4 and SW6. Therefore, the capacitors C1 and C2 are maintained in the parallel connection state.

Next, in the drive phase (3) (i.e. time t4 to time t5) corresponding to the rising period (second half) of the switch voltage Vsw, after the drive phase (2) described above, the internal switch SW0 is maintained in the OFF state.

In addition, in the drive phase (3), the timing control circuit 22 turns off the internal switches SW1 and SW2, and turns on the internal switch SW3. Therefore, the application terminal of the boot voltage Vb and the application terminal of the upper side gate drive signal HG are electrically connected to each other, and hence the input gate capacitance Ciss of the upper side transistor 10H is charged using the boot voltage Vb.

Note that in the drive phase (3), similarly to the drive phases (1) and (2) described above, the timing control circuit 22 maintains the internal switch SW5 in the OFF state and the internal switches SW4 and SW6 in the ON state. Therefore, the capacitors C1 and C2 are maintained in the parallel connection state.

Next, in the drive phase (4) (i.e. time t5 to time t6) corresponding to the high level period of the switch voltage Vsw, after the drive phases (2) and (3) described above, the internal switch SW0 is maintained in the OFF state.

In addition, in the drive phase (4), similarly to the drive phase (3) described above, the timing control circuit 22 maintains the internal switches SW1 and SW2 in the OFF state and the internal switch SW3 in the ON state. Therefore, the upper side gate drive signal HG is at high level (i.e. Vb), and the upper side transistor 10H is fully turned on.

In addition, in the drive phase (4), the timing control circuit 22 turns off the internal switches SW4 and SW6, and turns on the internal switch SW5. Therefore, the capacitors C1 and C2 are connected in series, and the capacitance value C21 of the capacitor circuit 21 is decreased to satisfy C21=C1×C2/(C1+C2). As a result, the decrease of the boot voltage Vb due to the charge of the input gate capacitance Ciss can be suppressed.

Figure 6:
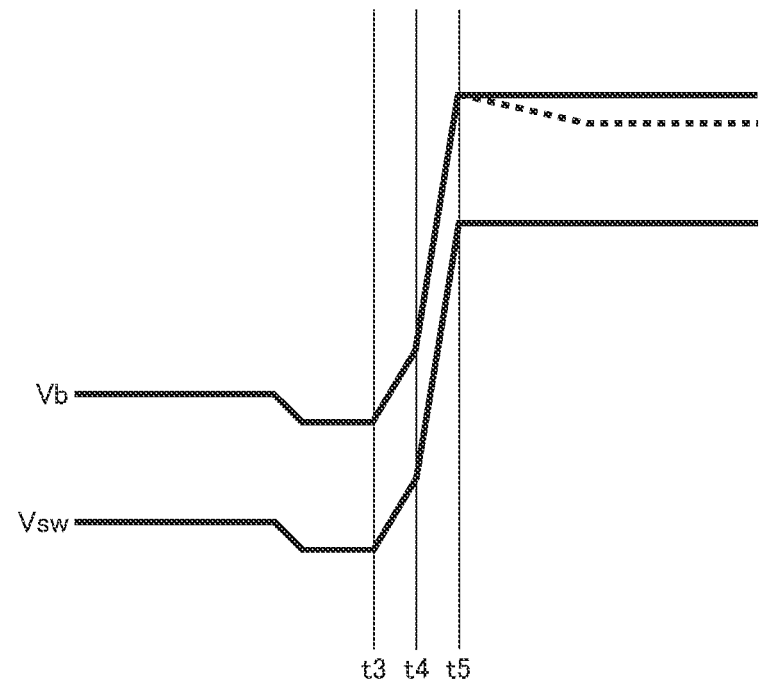
FIG. 6 is a diagram illustrating rising behaviors of the switch voltage and the boot voltage.

FIG. 6 is a diagram illustrating rising behaviors of the switch voltage Vsw and the boot voltage Vb. Note that time t3 to time t5 in this diagram corresponds to time t3 to time t5 described above.

As described above, in the rising period (first half) of the switch voltage Vsw from time t3 to time t4, the precharge of the input gate capacitance Ciss is performed using the input voltage Vi. After that, in the rising period (second half) of the switch voltage Vsw from time t4 to time t5, a remaining portion of the input gate capacitance Ciss is charged using the boot voltage Vb. Note that rising gradients of the switch voltage Vsw and the boot voltage Vb from time t3 to time t4 and from time t4 to time t5 are varied depending on the ON resistances of the internal switches SW3 and SW4.

In addition, in the high level period of the switch voltage Vsw after time t5, the capacitance value C21 of the capacitor circuit 21 is decreased, and hence the decrease of the boot voltage Vb due to the charge of the input gate capacitance Ciss is suppressed (compare the solid line with the broken line of the boot voltage Vb).

In this way, even if the boot capacitor Cb has a small capacitance, the upper side driver 20H of this structural example suppresses the decrease of the boot voltage Vb so that the gate-source voltage Vgs of the upper side transistor 10H can be secured. Therefore, the upper side transistor 10H can be fully turned on without fail, and hence the on-resistance value of the upper side transistor 10H can be reduced to contribute to improvement in efficiency.

Internal Switch and Timing Control Circuit

Figure 7:
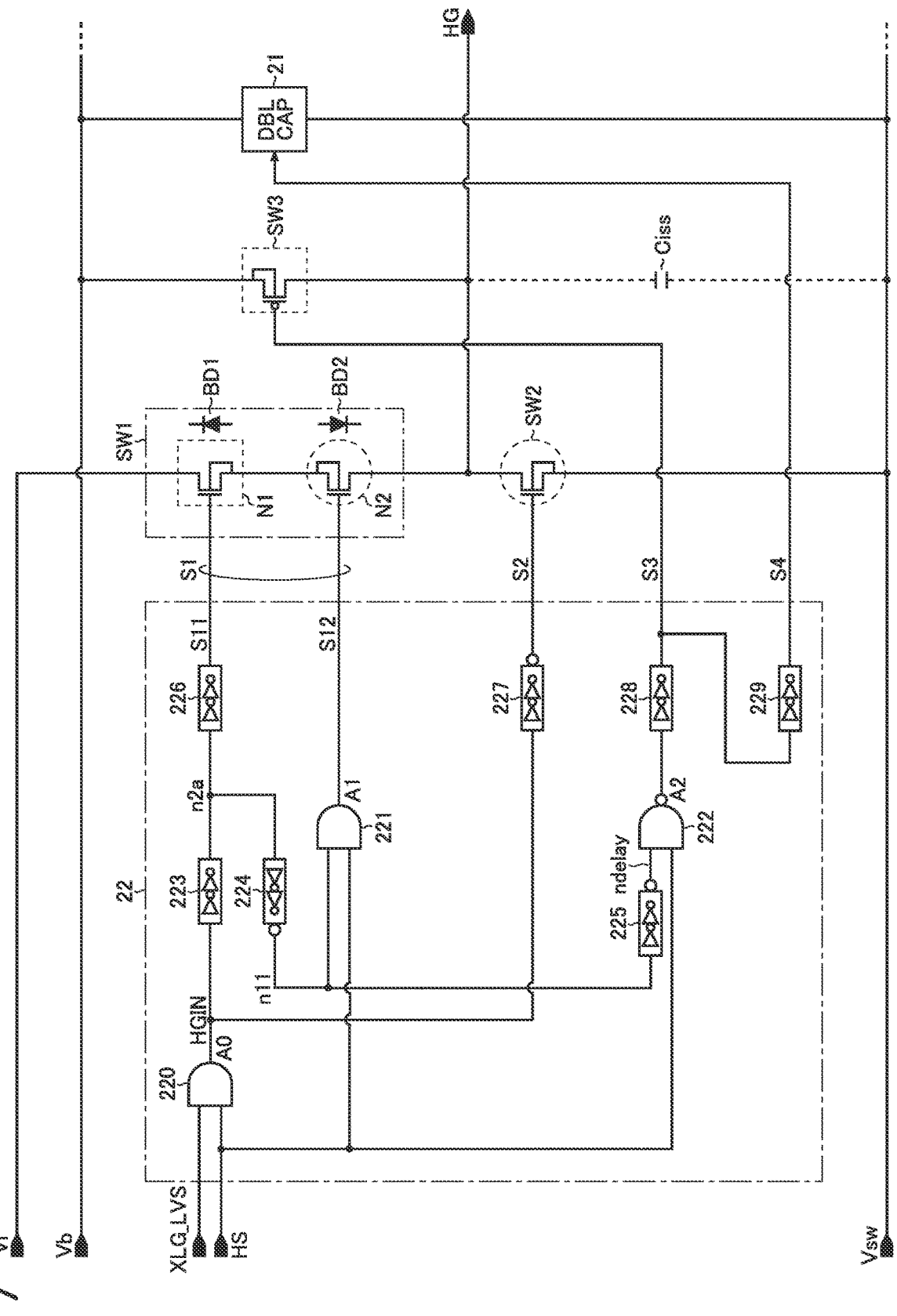
FIG. 7 is a diagram illustrating one structural example of an internal switch and a timing control circuit.

FIG. 7 is a diagram illustrating one structural example of the internal switches SW1 to SW3, and the timing control circuit 22.

The internal switch SW1 includes an N-channel type double-diffused MOS field effect transistor (NDMOSFET) N1 and an N-channel type MOS field effect transistor (NMOSFET) N2. In addition, an NMOSFET and a PDMOSFET are used as the internal switches SW2 and SW3, respectively.

The transistor N1 has a drain connected to the application terminal of the input voltage Vi. Sources of the transistors N1 and N2 are connected to each other. The transistor N2 has a drain connected to the application terminal of the upper side gate drive signal HG (i.e. the gate of the upper side transistor 10H). Gates of the transistors N1 and N2 are connected to application terminals of switch control signals S11 and S12, respectively (corresponding to the switch control signal S1 described above).

The transistor N1 turns on when the switch control signal S11 is at high level (i.e. Vb), and turns off when the switch control signal S11 is at low level (i.e. Vsw). In addition, the transistor N2 turns on when the switch control signal S12 is at high level (i.e. Vb), and turns off when the switch control signal S12 is at low level (i.e. Vsw).

Note that the transistors N1 and N2 are accompanied with body diodes BD1 and BD2, respectively, whose cathode is the drain of the transistor, and whose anode is the source of the same.

In general, a DMOSFET has advantages in higher withstand voltage, lower on-resistance, larger current, higher speed, and the like than a MOSFET. Therefore, it is preferred to use the transistor N1 that is an NDMOSFET, as the internal switch SW1.

However, if the transistor N1 is solely used as the internal switch SW1, when a reverse bias is applied to the transistor N1 (i.e. when SW3 is turned on), current flows in the body diode BD1 from the application terminal of the upper side gate drive voltage HG to the application terminal of the input voltage Vi, and a part of the current flows into a p type substrate as sub-leak current, resulting in a rise of the substrate potential.

Therefore, the internal switch SW1 includes, other than the transistor N1 (NDMOSFET), the transistor N2 (NMOSFET) connected in series with the transistor N1 the opposite direction to the same. With this structure, the body diode BD2 of the transistor N2 can stop the sub-leak current when the reverse bias is applied, and hence the rise of the substrate potential can be suppressed.

Figure 8:
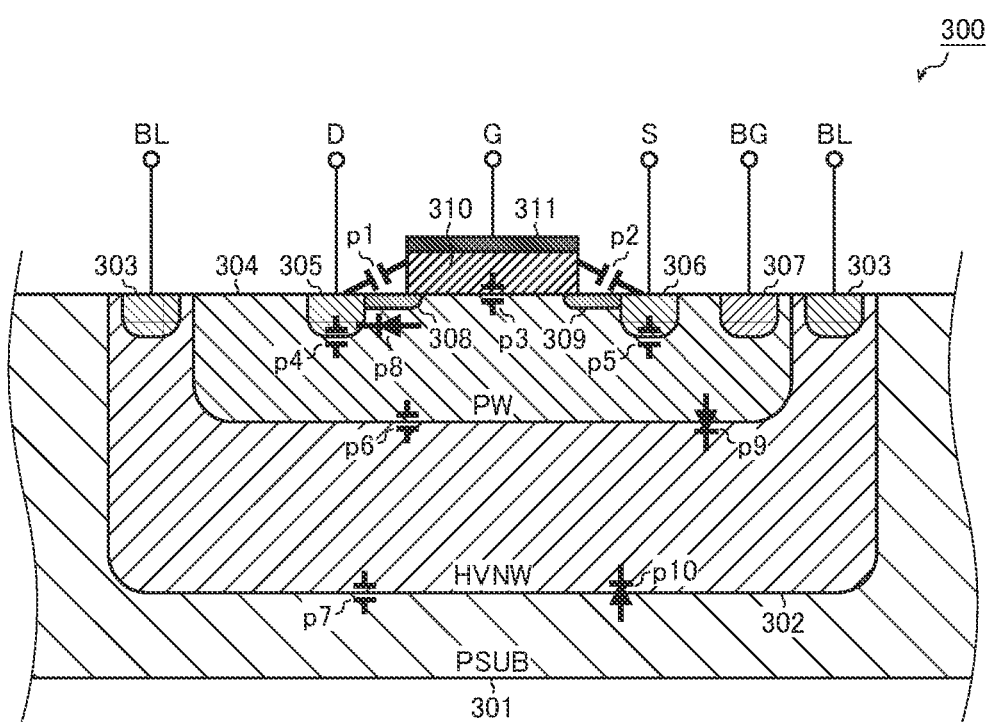
FIG. 8 is a diagram illustrating a vertical cross section of an NMOSFET.

FIG. 8 is a diagram illustrating a vertical cross section of an NMOSFET used as the transistor N2. An NMOSFET 300 includes a p type substrate 301, an n type well 302, an n+ type semiconductor region 303, a p type well 304, an n+ type semiconductor region 305, an n+ type semiconductor region 306. a p+type semiconductor region 307, n-type semiconductor regions 308 and 309, a gate oxide film 310, and a the gate electrode 311.

The n type well 302 is formed in the p type substrate 301. The n type well 302 is applied with the boot voltage Vb via the n+ type semiconductor region 303. Therefore, the n type well 302 functions as a buried layer BL for electrical separation between the p type substrate 301 and the p type well 304.

The n+ type semiconductor region 303 is formed in the surface (periphery) of the n type well 302, and functions as a contact for application of the boot voltage Vb.

The p type well 304 is formed in the surface of the n type well 302 (in the area surrounded by the n+ type semiconductor region 303), and functions as a backgate (BG) of the NMOSFET 300.

The n+ type semiconductor region 305 is formed in the surface of the p type well 304 and functions as a drain (D) of the NMOSFET 300.

The n+ type semiconductor region 306 is formed in the surface of the p type well 304 at a position apart from the n+ type semiconductor region 305 by a predetermined distance, and functions as a source (S) of the NMOSFET 300.

The p+ type semiconductor region 307 is formed in the surface (periphery) of the p type well 304, and functions as a contact of the backgate (BG).

The n− type semiconductor region 308 is formed in the surface of the p type well 304 from a position adjacent to the n+ type semiconductor region 305 to a position just under the outer edge of the gate oxide film 310.

The n− type semiconductor region 309 is formed in the surface of the p type well 304 from a position adjacent to the n+ type semiconductor region 306 to a position just under the outer edge of the gate oxide film 310.

The gate oxide film 310 is formed on the surface of the p type well 304.

The gate electrode 311 is formed on the surface of the gate oxide film 310.

Note that the NMOSFET 300 is accompanied with parasitic capacitors p1 to p7 and parasitic diodes p8 to p10 formed at portions thereof.

More specifically, the parasitic capacitors p1 to p3 are formed between the gate oxide film 310 and the n+ type semiconductor region 305, between the gate oxide film 310 and the n+ type semiconductor region 306, and between the gate oxide film 310 and the p type well 304, respectively. In addition, the parasitic capacitors p4 and p5 are formed between the p type well 304 and the n+ type semiconductor region 305, and between the p type well 304 and the n+ type semiconductor region 306, respectively. Further, the parasitic capacitors p6 and p7 are formed between the n type well 302 and the p type well 304, and between the n type well 302 and the p type substrate 301, respectively.

In contrast, the parasitic diode p8 is formed between the n+ type semiconductor region 305 and the p type well 304. The parasitic diode p8 has a cathode in the n+ type semiconductor region 305 and an anode in the p type well 304. In addition, the parasitic diode p9 is formed between the n type well 302 and the p type well 304. The parasitic diode p9 has a cathode in the n type well 302 and an anode in the p type well 304. Further, the parasitic diode p10 is formed between the n type well 302 and the p type substrate 301. The parasitic diode p10 has a cathode in the n type well 302 and an anode in the p type substrate 301.

Note that when the NMOSFET 300 is used as the transistor N2 of the internal switch SW1, the parasitic diode p8 in this diagram corresponds to the body diode BD2 described above.

With reference to FIG. 7 again, the internal structure of the timing control circuit 22 is further described. The timing control circuit 22 includes AND gates 220 and 221, a NAND gate 222, and delay stages 223 to 229. Note that a single inverter or an inverter stage including a plurality of inverters connected in series should be used, for example, as the delay stages 223 to 229.

The AND gate 220 generates an AND signal A0 of an inverted lower side gate drive signal XLG_LVS (i.e. a logically inverted and level shifted signal of the lower side gate drive signal LG) and the upper side gate control signal HS, and outputs the same as an internal input signal HGIN. Therefore, the internal input signal HGIN becomes high level when the inverted lower side gate drive signal XLG_LVS and the upper side gate control signal HS are both at high level, and it becomes low level when at least one of the inverted lower side gate drive signal XLG_LVS and the upper side gate control signal HS is at low level.

Note that the inverted lower side gate drive signal XLG_LVS is input for the timing control circuit 22 to recognize that the lower side transistor 10L is turned off. More specifically, the upper side transistor 10H is turned on after the inverted lower side gate drive signal XLG_LVS rises to high level, and hence simultaneous turning on of the upper side transistor 10H and the lower side transistor 10L can be avoided so that excessive shoot-through current can be suppressed.

The AND gate 221 generates an AND signal A1 of a node signal n11 (i.e. a logically inverted signal of a node signal n2a) and the upper side gate control signal HS, and outputs the same as the switch control signal S12. Therefore, the switch control signal S12 becomes high level when the node signal n11 and the upper side gate control signal HS are both at high level, and becomes low level when at least one of the node signal n11 and the upper side gate control signal HS is at low level.

The NAND gate 222 generates a NAND signal A2 of the node signal ndelay (i.e. a delayed and logically inverted signal of the node signal n11) and the upper side gate control signal HS. Therefore, the NAND signal A2 becomes low level when the node signal ndelay and the upper side gate control signal HS are both at high level, and becomes high level when at least one of the node signal ndelay and the upper side gate control signal HS is at low level.

The delay stage 223 gives an appropriate delay to the internal input signal HGIN so as to generate the node signal n2a.

The delay stage 224 gives an appropriate delay to the node signal n2a and inverts the logical level thereof, so as to generate the node signal n11. Note that if it is not necessary to delay the node signal n2a, a single inverter should be used as the delay stage 224.

The delay stage 225 gives an appropriate delay to the node signal n11 and inverts the logical level thereof so as to generate the node signal ndelay.

The delay stage 226 gives an appropriate delay to the node signal n2a so as to generate the switch control signal S11.

The delay stage 227 gives an appropriate delay to the internal input signal HGIN and inverts the logical level thereof so as to generate the switch control signal S2.

The delay stage 228 gives an appropriate delay to the NAND signal A2 so as to generate the switch control signal S3.

The delay stage 229 gives an appropriate delay to the switch control signal S3 so as to generate the switch control signal S4.

Figure 9:
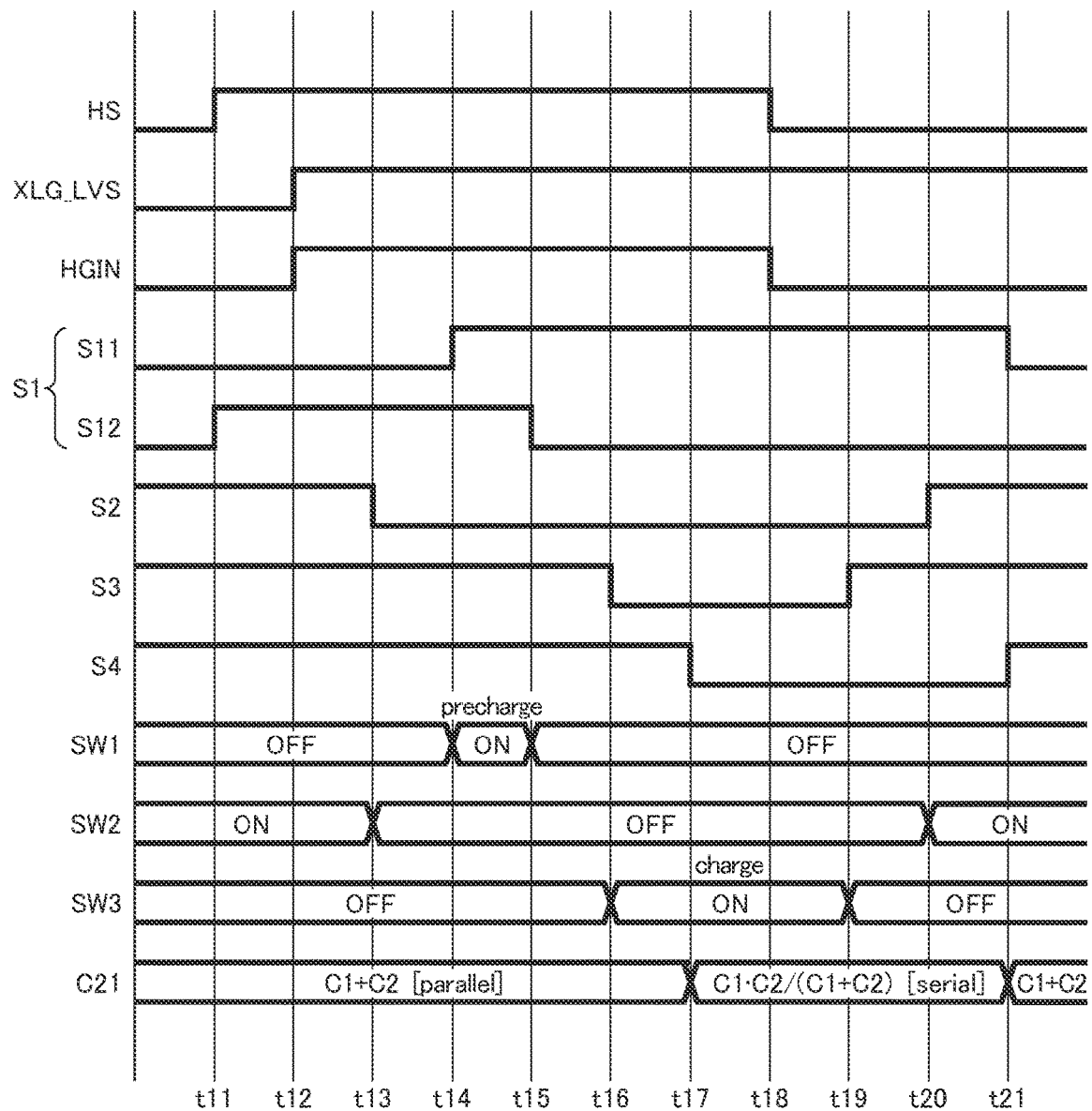
FIG. 9 is a diagram illustrating one operational example of the timing control circuit.

FIG. 9 is a diagram illustrating one operational example of the timing control circuit 22, and shows the upper side gate control signal HS, the inverted lower side gate drive signal XLG_LVS, the internal input signal HGIN, the switch control signals S1 to S4, ON/OFF states of the internal switches SW1 to SW3, and the capacitance value C21 of the capacitor circuit 21, in order from top to bottom.

Before time t11, the upper side gate control signal HS is at low level, and hence the internal input signal HGIN is also at low level. In this case, the switch control signals S11 and S12 are both at low level, the transistors N1 and N2 are both turned off. In other words, the internal switch SW1 is turned off. In contrast, the switch control signals S2 and S3 are both at high level, the internal switch SW2 is turned on, and the internal switch S3 is turned off. Therefore, the upper side gate drive signal HG is decreased to low level, and hence the upper side transistor 10H is fully turned off. In addition, the switch control signal S4 is at high level, and the capacitance value C21 of the capacitor circuit 21 satisfies C21=C1+C2 (parallel combination value).

At time t11, the upper side gate control signal HS is raised to high level. At this time point, the node signal n11 (not shown) is at high level, the AND signal A1 (not shown) rises to high level, and the switch control signal S12 rises to high level. In contrast, at this time point, the inverted lower side gate drive signal XLG_LVS is at low level, the internal input signal HGIN is also at low level, and the switch control signal S11 is maintained at low level. As a result, the transistor N1 is turned off while the transistor N2 is turned on.

In this way, the timing control circuit 22 turns on the transistor N2 (NMOSFET) before turning on the transistor N1 (NDMOSFET). In other words, the entire internal switch SW1 maintains the OFF state, and only the transistor N2 is turned on. With this timing control, it is possible to early turn on the transistor N2 that is less faster than the transistor N1, so as to decrease the on-resistance thereof.

At time t12, the inverted lower side gate drive signal XLG_LVS rises to high level, and the internal input signal HGIN rises to high level. However, at this time point, the logical levels of the switch control signals S1 to S4 are not changed, and hence any one of the ON/OFF states of the internal switches SW1 to SW3 and the capacitance value C21 of the capacitor circuit 21 does not change.

At time t13, the switch control signal S2 that is the delayed and logically inverted signal of the internal input signal HGIN falls to low level, and the internal switch SW2 is turned off. Therefore, the internal switches SW1 to SW3 are all turned off, so that the application terminal of the upper side gate drive signal HG temporarily becomes a high impedance state.

At time t14, the switch control signal S11 that is the delayed signal of the internal input signal HGIN rises to high level, and the transistor N1 is turned on. At this time point, the transistors N1 and N2 are both turned on, and the internal switch SW1 turns on so that precharge of the input gate capacitance Ciss with the input voltage Vi is started.

At time t15, the node signal n11 (not shown) that is the delayed and logically inverted signal of the internal input signal HGIN falls to low level, and the AND signal A1 (not shown) falls to low level, and consequently the switch control signal S12 falls to low level. As a result, the transistor N2 is turned off. In contrast, at this time point, the node signal ndelay (not shown) is at low level, and hence the NAND signal A2 (not shown) is at high level, and the switch control signal S3 is maintained at high level. In other words, the internal switch SW3 is turned off.

In this way, the timing control circuit 22 turns off the transistor N2 (therefore the internal switch SW1) before turning on the internal switch SW3 so as to start the charging with the boot voltage Vb. With this timing control, the sub-leak current of the transistor N1 when the reverse bias is applied can be securely stopped.

Note that when the transistor N2 turns off at the timing described above, the body diode BD2 is biased forward until the potential difference between the input voltage Vi and the upper side gate drive signal HG becomes smaller than a forward voltage drop Vf of the body diode BD2, and hence the precharge of the input gate capacitance Ciss with the input voltage Vi is continued.

In addition, the transistor N2 is not an NDMOSFET but an NMOSFET, and hence when current flows in the body diode BD2, sub-leak current to the p type substrate does not occur.

At time t16, after the high level transition of the node signal ndelay (not shown) and the low level transition of the NAND signal A2 (not shown), the switch signal S3 that is a delayed signal of the NAND signal A2 falls to low level. As a result, the internal switch SW3 is turned on, and the charge of the input gate capacitance Ciss with the boot voltage Vb is started.

At time t17, the switch control signal S4 that is a delayed signal of the switch control signal S3 falls to low level. In this case, the capacitance value C21 of the capacitor circuit 21 is decreased to satisfy C21=C1×C2/(C1+C2) (series combination value). As a result, the decrease of the boot voltage Vb due to the charge of the input gate capacitance Ciss can be suppressed.

At time t18, the upper side gate control signal HS falls to low level, and the internal input signal HGIN falls to low level. However, at this time point, logical levels of the switch control signals S1 to S4 are not changed, and hence any one of the ON/OFF states of the internal switches SW1 to SW3 and the capacitance value C21 of the capacitor circuit 21 does not change.

At time t19, after the high level transition of the NAND signal A2 (not shown), the switch signal S3 that is the delayed signal of the NAND signal A2 rises to high level, and the internal switch SW3 is turned off. Therefore, the internal switches SW1 to SW3 are all turned off, and the application terminal of the upper side gate drive signal HG temporarily becomes a high impedance state.

At time t20, the switch control signal S2 that is the delayed and logically inverted signal of the internal input signal HGIN rises to high level, and the internal switch SW2 is turned on. Therefore, the upper side gate drive signal HG is decreased to low level, and the upper side transistor 10H is fully turned off.

At time t21, the switch control signal S4 that is the delayed signal of the switch control signal S3 rises to high level. As a result, the capacitance value C21 of the capacitor circuit 21 is increased to satisfy C21=C1+C2 (parallel combination value). In addition, the switch control signal S11 that is the delayed signal of the internal input signal HGIN falls to low level, and the transistor N1 is turned off.

Other Variations

Note that other than the embodiments described above, the various technical features disclosed in this specification can be variously modified without deviating from the spirit of the technical creation. For instance, the gate driver disclosed in this specification may be aimed at driving an IGBT. In this way, the embodiments described above are merely examples in every aspect and should not be interpreted as limitations. The technical scope of the present invention is not limited to the embodiments described above, and should be understood to include all modifications within meanings and ranges equivalent to the claims.

Industrial Applicability

The gate driver disclosed in this specification can be used as means arranged to drive an upper side transistor (such as an NMOSFET) of a half bridge output stage, for example.

LIST OF REFERENCE SIGNS 1 switching power supply
10H upper side transistor (NMOSFET)
10L lower side transistor (MOSFET)
20H upper side driver
20L lower side driver
21 capacitor circuit
22 timing control circuit
220, 221 AND gate
222 NAND gate
223 to 229 delayed stage
30H upper side level shifter
30L lower side level shifter
40 logic circuit
100 semiconductor device (power supply control IC)
300 NMOSFET
301 p type substrate
302 n type well
303 n+ type semiconductor region (contact)
304 p type well
305 n+ type semiconductor region (drain)
306 n+ type semiconductor region (source)
307 p+ type semiconductor region (contact)
308, 309 n− type semiconductor region
310 gate oxide film
311 gate electrode
BD1, BD2 body diode
C, C1, C2 capacitor
Cb boot capacitor
DLY delay stage
L inductor
N1 NDMOSFET
N2 NMOSFET
p1 to p7 parasitic capacitor
p8 to p10 parasitic diode
SW0 to SW6 internal switch

The invention claimed is:

1. A gate driver arranged to drive an N-channel type transistor connected between an application terminal of an input voltage and an application terminal of a switch voltage, the gate driver comprising:
a capacitor circuit connected between an application terminal of a boot voltage and the application terminal of the switch voltage, the boot voltage being higher than the switch voltage by a voltage between both ends of a boot capacitor, and
a timing control circuit arranged to charge an input gate capacitance of the transistor with the boot voltage after precharging the same with the input voltage during turn-on transition of the transistor, and to decrease capacitance value of the capacitor circuit after the turn-on transition of the transistor.

2. The gate driver according to claim 1 further comprising:
a first internal switch connected between the application terminal of the input voltage and a gate of the transistor;
a second internal switch connected between the gate of the transistor and the application terminal of the switch voltage, and
a third internal switch connected between the application terminal of the boot voltage and the gate of the transistor, wherein
the timing control circuit controls switching timings of the first internal switch, the second internal switch, and the third internal switch.

3. The gate driver according to claim 2, wherein
the capacitor circuit includes a first capacitor having a first end connected to the application terminal of the boot voltage, a second capacitor having first end connected to the application terminal of the switch voltage, a fourth internal switch connected between a second end of the first capacitor and the application terminal of the switch voltage, a fifth internal switch connected between the second end of the first capacitor and a second end of the second capacitor, and a sixth internal switch connected between the application terminal of the boot voltage and the second end of the second capacitor, and
the timing control circuit controls switching timings of the fourth internal switch, the fifth internal switch, and the sixth internal switch.

4. The gate driver according to claim 3, wherein the timing control circuit sequentially switches among:
a first drive phase, in which the first internal switch, the third internal switch, and the fifth internal switch are turned off, while the second internal switch, the fourth internal switch, and the sixth internal switch are turned on;
a second drive phase, in which the second internal switch, the third internal switch, and the fifth internal switch are turned off, while the first internal switch, the fourth internal switch, and the sixth internal switch are turned on;
a third drive phase, in which the first internal switch, the second internal switch, and the fifth internal switch are turned off, while the third internal switch, the fourth internal switch, and the sixth internal switch are turned on; and
a fourth drive phase, in which the first internal switch, the second internal switch, the fourth internal switch, and the sixth internal switch are turned off, while the third internal switch and the fifth internal switch are turned on.

5. The gate driver according to claim 2, wherein the first internal switch includes an NDMOSFET having a drain connected to the application terminal of the input voltage, and an NMOSFET having a source connected to a source of the NDMOSFET and a drain connected to the gate of the transistor.

6. The gate driver according to claim 5, wherein the timing control circuit turns on the NMOSFET before turning on the NDMOSFET, and turns off the NMOSFET before turning on the third internal switch.

7. The gate driver according to claim 2, wherein the third internal switch is a PDMOSFET.

8. A semiconductor device comprising an integration of the gate driver according to claim 1.

9. The semiconductor device according to claim 8, further comprising an integration of a boot capacitor connected between the application terminal of the boot voltage and the application terminal of the switch voltage.

10. The semiconductor device according to claim 8, further comprising an integration of an N-channel type transistor connected between the application terminal of the input voltage and the application terminal of the switch voltage.

\* \* \* \* \*